(12) United States Patent
Boyd et al.

(10) Patent No.: US 11,513,264 B2
(45) Date of Patent: *Nov. 29, 2022

(54) METHODS FOR MAKING COMPOSITIONS OF MATERIALS FOR FORMING COATINGS AND LAYERED STRUCTURES INCLUDING ELEMENTS FOR SCATTERING AND PASSING SELECTIVELY TUNABLE WAVELENGTHS OF ELECTROMAGNETIC ENERGY

(71) Applicant: FACE INTERNATIONAL CORPORATION, Norfolk, VA (US)

(72) Inventors: Clark D Boyd, Portsmouth, VA (US); Bradbury R Face, Smithfield, VA (US); Jeffrey D Shepard, Norco, CA (US)

(73) Assignee: FACE INTERNATIONAL CORPORATION, Norfolk, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/324,044

(22) Filed: May 18, 2021

(65) Prior Publication Data

US 2021/0278575 A1 Sep. 9, 2021

Related U.S. Application Data

(62) Division of application No. 15/415,857, filed on Jan. 25, 2017, now Pat. No. 11,009,632.

(51) Int. Cl.
*B05D 5/06* (2006.01)
*G02B 5/02* (2006.01)
(Continued)

(52) U.S. Cl.
CPC .............. *G02B 5/0294* (2013.01); *C08K 9/10* (2013.01); *C09D 5/006* (2013.01);
(Continued)

(58) Field of Classification Search
CPC ......... G02B 5/0294; B05D 5/065; C08K 9/10
See application file for complete search history.

(56) References Cited

U.S. PATENT DOCUMENTS 4,967,956 A 11/1990 Mansfield et al.
5,292,784 A * 3/1994 McKinney ............ H01J 29/896
427/164

(Continued)

FOREIGN PATENT DOCUMENTS

KR 20110031645 A 3/2011
WO 2014178180 A1 11/2014

OTHER PUBLICATIONS

International Search Report for PCT/UC2016/027393 dated Jul. 29, 2016.
Written Opinion for PCT/US2016/027393 dated Jul. 29, 2016.

*Primary Examiner* — Elizabeth A Burkhart
(74) *Attorney, Agent, or Firm* — Lowndes; Stephen C. Thomas

(57) ABSTRACT

Methods are provided for forming a particular multi-layer micron-sized particle that is substantially transparent, yet that exhibits selectable coloration based on its physical properties. The disclosed physical properties of the particle are controllably selectable refractive indices to provide an opaque-appearing energy transmissive material when pluralities of the particles are suspended in a substantially transparent matrix material. Multiply-layered (up to 30+ constituent layers) particles result in an overall particle diameter of less than 5 microns. The material suspensions render the particles deliverable as aspirated or aerosol compositions onto substrates to form layers that selectively scatter specific wavelengths of electromagnetic energy while allowing remaining wavelengths of the incident energy to pass. The disclosed particles and material compositions uniquely implement optical light scattering techniques in (Continued)

Figure 1:
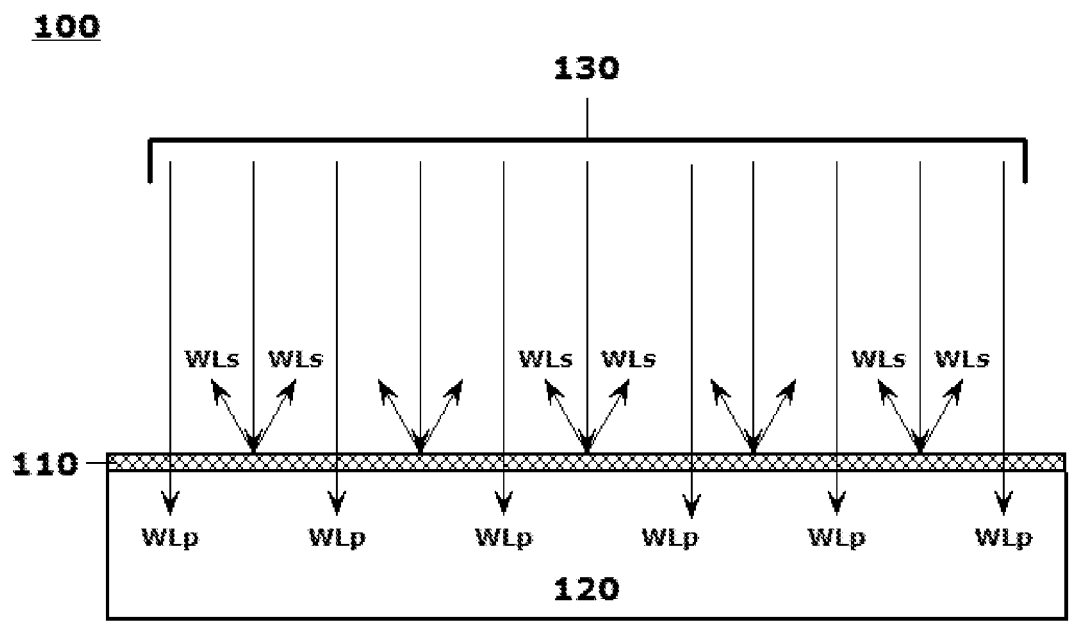

energy (or light) transmissive layers that appear selectively opaque, while allowing 80+% of the energy impinging on the light incident side to pass through the layers.

4 Claims, 7 Drawing Sheets

(51) Int. Cl.
    *C08K 9/10*     (2006.01)
    *G02B 5/28*     (2006.01)
    *C09D 5/00*     (2006.01)
    *C23C 16/455*     (2006.01)
    *B05D 1/02*     (2006.01)

(52) U.S. Cl.
    CPC ...... *C23C 16/45525* (2013.01); *G02B 5/0226* (2013.01); *G02B 5/0278* (2013.01); *G02B 5/285* (2013.01); *B05D 1/02* (2013.01); *B05D 5/065* (2013.01)

(56) References Cited

U.S. PATENT DOCUMENTS

| | | |
|---|---|---|
| 5,877,874 A | 3/1999 | Rosenberg |
| 8,669,325 B1 | 3/2014 | Hyman |
| 10,347,777 B2 * | 7/2019 | Boyd ..................... B62D 25/12 |
| 10,886,873 B2 * | 1/2021 | Boyd ..................... H02S 20/22 |
| 2003/0194490 A1 * | 10/2003 | Budd ..................... G02B 5/128 |
| | | 427/212 |
| 2005/0019712 A1 | 1/2005 | Ikeda et al. |
| 2008/0213513 A1 * | 9/2008 | Kameshima ...... G02F 1/133502 |
| | | 428/1.32 |
| 2009/0269579 A1 * | 10/2009 | Minaki ................. G02B 5/223 |
| | | 428/338 |
| 2010/0278561 A1 | 11/2010 | Kanda et al. |
| 2011/0265689 A1 * | 11/2011 | Schumacher ........... C09C 1/003 |
| | | 106/417 |
| 2011/0278434 A1 | 11/2011 | Chau et al. |
| 2014/0185282 A1 | 7/2014 | Hsu et al. |

\* cited by examiner

METHODS FOR MAKING COMPOSITIONS OF MATERIALS FOR FORMING COATINGS AND LAYERED STRUCTURES INCLUDING ELEMENTS FOR SCATTERING AND PASSING SELECTIVELY TUNABLE WAVELENGTHS OF ELECTROMAGNETIC ENERGY This application is a divisional application of U.S. patent application Ser. No. 15/415,857, entitled METHODS FOR MAKING COMPOSITIONS OF MATERIALS FOR FORMING COATINGS AND LAYERED STRUCTURES INCLUDING ELEMENTS FOR SCATTERING AND PASSING SELECTIVELY TUNABLE WAVELENGTHS OF ELECTROMAGNETIC ENERGY, which was filed in the United States Patent and Trademark Office (USPTO) on Jan. 25, 2017 and which published as U.S. pre-grant patent publication number US 2018-0210122 A1 on Jul. 26, 2018, and which issued from the USPTO as U.S. Pat. No. 11,009,632 on May 18, 2021, which is herein incorporated by reference in its entirety; this application is also related to U.S. patent application Ser. No. 15/415,851, which was filed in the USPTO on Jan. 25, 2017 and which published as United States Patent and Trademark Office (USPTO) pre-grant publication number US2018-0210121 A1 on Jul. 26, 2018, and issued as U.S. Pat. No. 10,247,861 on Apr. 2, 2019 entitled "Compositions of Materials for Forming Coatings and Layered Structures Including Elements for Scattering and Passing Selectively Tunable Wavelengths of Electromagnetic Energy", the disclosure of which is incorporated herein by reference in its entirety; and this application is also related to U.S. patent application Ser. No. 15/415,864, which was filed in the USPTO on Jan. 25, 2017 and which published as USPTO pre-grant publication number US 2018-0210119 A1 on Jul. 26, 2018 entitled "Delivery Systems and Methods For Compositions of Materials For Forming Coatings And Layered Structures Including Elements For Scattering and Passing Selectively Tunable Wavelengths Of Electromagnetic Energy", the disclosure of which is hereby incorporated by reference herein in its entirety.

BACKGROUND

1. Field of the Disclosed Embodiments

This disclosure describes forming a particular multi-layer micron-sized particle that is substantially transparent, yet that exhibits selectable coloration based on the physical properties of the particle layers manipulated in the forming process, resulting in the particles exhibiting controllable refractive indices. Also, material suspensions are provided for the particles to render them deliverable to form unique electromagnetic energy transmissive layers on substrates. These disclosed layers, once formed, selectively scatter specific wavelengths of electromagnetic energy back in an incident direction while allowing remaining wavelengths to pass therethrough, including uniquely implementing optical light scattering techniques in such energy (or light) transmissive layers to make those layers appear selectively opaque when observed from a light incident side, while allowing at least 50%, and as much as 80+%, of the energy impinging on the light incident side to pass through the layer.

2. Related Art

An ability to provide or promote selective transmission of electromagnetic energy, including light in the visual or near-visual radiofrequency (RF) spectrum, through layers, materials, structures or structural components provides substantial benefit in a number of real-world use cases and applications. U.S. patent application Ser. No. 15/006,143 (the 143 application), entitled "Systems and Methods for Producing Laminates, Layers and Coatings Including Elements for Scattering and Passing Selective Wavelengths of Electromagnetic Energy" which published from the USPTO as U.S. pre-grant patent publication number US 2016-0306078 A1 on Oct. 20, 2016, the disclosure of which is incorporated herein by reference in its entirety; and U.S. patent application Ser. No. 15/006,145 (the 145 application), entitled "Systems and Methods for Producing Objects Incorporating Selective Electromagnetic Energy Scattering Layers, Laminates and Coatings" which published from the USPTO as U.S. pre-grant patent publication number US 2016-0306080 A1 on Oct. 20, 2016 and which issued as U.S. Pat. No. 10,795,062 on Oct. 6, 2020, the disclosure which is also hereby incorporated by reference herein in its entirety, describe a basic structure for forming such selectively energy transmissive layers, and certain real world use cases in which those layers may be particularly advantageously employed. The 143 and 145 applications discuss, as background, conventional methods for modifying windows, skylights and the like to limit, filter or otherwise modify an amount of light that is, or constituent wavelengths of the light that are, transmitted into the structure via these windows and/or skylights. The modifications to the formerly transparent structures may limit an ability to see through a particular window or skylight to address privacy, security and/or other related concerns. The 143 and 145 applications discuss conventional techniques that, whether implemented to address simple aesthetics, or for other reasons, modify the light transmissive properties of the windows, skylights and/or constituent panels or panes substantially in both directions equally.

The 143 and 145 applications describe other techniques for modifying some light transmissive properties in certain structural panels including, for example, what are alternatively referred to as one-way or two-way mirrors, and certain high-end vehicle window tinting. Again here it is noted that the light always passes through the mirror or tinted window exactly equally in both directions. Thus, the principle of operation is to keep one side brightly lit rendering that side "difficult" to see through based on the principle that the reflected light masks visual penetration of the mirror from the brightly lit side. The coatings or embedded layers, which are applied to, or included in, the mirror or window panels, ensure that a substantial portion of the incident light is reflected back from the "lighted" side of the mirror or tinted window, adversely affect the light transmissive properties of the ambient light incident to the lighted side of the mirror or tinted window as it passes through the panel.

The 143 and 145 applications note that in recent years, the fields of energy harvesting and ambient energy collection have gained significantly increased interest. The 143 and 145 applications discuss photovoltaic (PV) cell layers and other photocell layers, including thin film PV-type (TFPV) material layers, that are advantageously employed on outer surfaces of particular structures to convert ambient light to electricity. The efficiency of a particular PV layer is affected by its capacity to absorb, and/or to minimize reflectance of, incident light on the surface of the layer. For this reason, photocells and PV light absorbing material layers are generally formed to have dark, normally black or dark grey, exposed light-facing or light-incident ("facial") surfaces. Maximum conversion efficiencies in operation of the PV layers (upward to 28+%) are achieved when the dark facial surfaces of these PV layers are exposed to unfiltered light in the visible, or near-visible, spectrum. While experimentation has been undertaken with other forms of, for example, thin film PV layers including transparent thin-films, the conversion efficiencies for these non-conventional (or non-black) layers fall to as low as approximately one third the conversion efficiencies of those of the conventional dark facial surfaces generally associated with photovoltaic cell layers. It is for this reason that, in virtually all conventional and most emerging installations, the PV layers are mounted unmodified on external surfaces of structures either (1) fully exposed, or (2) exposed behind clear (or substantially clear) glass, plastic or similar clear (substantially light transparent) protective outer surface layers that transmit the visual, or near-visual light, in an unmodified manner from the light-incident side of such protective layers to the dark facial surfaces of the PV layers. Any such protective outer surface layers may provide some protection against adverse environmental effects and/or damage to facial surfaces of the PV layers, which tend to be comparatively fragile, but they provide generally no manner by which to modify the unfortunate aesthetic drawbacks presented by typical PV cell installations.

The 143 and 145 applications note that significant drawbacks to wider proliferation of photocells used in a number of potentially beneficial operating or employment scenarios are that such "required" installations, in many instances, adversely affect the aesthetics of the structure, object or host substrate surface on which the PV layers are mounted for use. Put another way, it is known that PV layers typically must be visible, in a substantially unimpeded, and/or unfiltered, manner to surrounding ambient light. It is further known that the visual appearance of the PV layers cannot be significantly altered from the comparatively dark greyscale to black presentations provided by the facial surfaces without rendering the photocells significantly less efficient, substantially degrading their operation. Presence of photocells and PV layers in most installations is, therefore, easily visually distinguishable, often in an aesthetically distracting or degrading manner. Based on these drawbacks and/or limitations, inclusion of photocell arrays, and even sophisticated thin film PV layers, is often avoided in many installations, or in association with many structures, objects or products, which may benefit from the electrical energy harvesting capacity provided by these layers. As such, photocell and other PV layer installations often become unacceptable visual detractors or distractors adversely affecting the appearance or ornamental design of the structures, objects or products on which the layers may be otherwise advantageously applied and employed.

SUMMARY

The 143 and 145 applications introduce systems and methods that provide particularly formulated energy or light transmissive overlayers. These overlayers, generally in the form of surface treatments and/or coverings, are formulated to support unique energy transmission and light refraction schemes to effectively "trick" the human eye into seeing a generally opaque presentation of the surface when observed from a light incident side. These overlayers are formulated to support transmission of visual light, or near-visual light, in a manner that allows a substantial percentage of the electromagnetic energy to penetrate the surface treatments and coverings in a comparatively unfiltered manner. Although particularly advantageously employed to support displayed visual optical effects, the principles according to this disclosure may be equally applicable to filtering wavelengths of electromagnetic energy lying outside the visual spectrum. The material compositions disclosed in the 143 and 145 applications, while important, and useful in many operational employment scenarios, are constrained in the manner in which the disclosed layers can be applied. Improvements on the layer compositions disclosed in those applications may provide greater latitude in the manufacturing processes by which objects including the disclosed particularized layers may be formed.

The 143 and 145 applications disclose advanced light scattering layers that are usable as object outer layers, systems for forming those outer layers and layer forming processes that provide particularly-adapted structures and light scattering layers that appear "opaque" from an outer, viewing, observation or energy/light-incident side, but that otherwise provide comparatively or substantially un-filtered energy/light transmissive property rendering the thus-formed layers, objects and/or object outer layers substantially energy/light transparent, as viewed from an inside of the formed object or from an opposite or non-energy/light-incident side of the formed structural layer or outer layer.

The energy transmissive layers disclosed in the 143 and 145 applications rely on a particular cooperation between refractive indices of the disclosed micron-sized particles or spheres with cooperating refractive indices of the matrix materials in which those micron-sized particles are suspended for deposition on prepared surfaces. This coincident requirement between the refractive indices of the matrix material and the refractive indices of the suspended particles limits deposition of these material suspensions of particles on substrates to techniques in which the deposition of the materials can be carefully controlled.

It would be advantageous to develop techniques by which to form suspended micron-sized particles in a manner that controls the refractive indices of the developed layers regardless of a delivery method by which the suspensions of micron-sized particles are deposited onto a broad spectrum of substrate surfaces.

Exemplary embodiments of the systems and methods according to this disclosure may improve upon the inventive concepts disclosed in the 143 and 145 applications by controlling the refractive indices of the particles themselves in the forming process to capture all of the physical parameters leading to independent color selection.

Exemplary embodiments may provide methods for forming substantially transparent micron-sized particles having a multi-layered structure in which refractive indices of the constituent elements/layers of which the multi-layered particles are controlled to produce repeatable coloration in the substantially transparent micron-sized particles.

Exemplary embodiments may dispose a substantially clear outer layer on the multi-layered structure of the substantially transparent micron-sized particles in a manner that assures that particle-to-particle refraction interference is minimized.

Exemplary embodiments may provide for the forming of matrix agnostic coloration particles allowing for the suspension of such particles in any clear or substantially clear (or transparent) matrix material, which may be then specially formulated to support other physical parameters with respect to the layers formed of the substantially transparent micron-sized particles. Such physical parameters may include, but are not limited to, toughness and durability of the finished layers, adhesion/adherence of the layers to a particular substrate, and/or particular curing techniques (heat curing, photo curing, and other like techniques) of the layers on respective substrates.

Exemplary embodiments may provide particle suspensions that are amenable to being entrained in airstreams for aspirated and/or aerosol delivery of the micron-sized particles in suspension onto various substrate surfaces.

Exemplary embodiments may provide delivery systems and methods for spraying particles suspensions onto various surfaces, and for promoting the formation, development, fixing and/or finishing the electromagnetic energy (or light) transmissive layers on all forms of substrates with wide latitude in the selection of aspirated and/or aerosol delivery devices.

Exemplary embodiments may form individual energy scattering layers out of substantially-transparent micron-sized particles, including nanoparticles, which may be particularly overcoated in substantially energy-neutral layers that control a minimum spacing of the coloration layers of the particles so as to substantially eliminate micro- and/or nano-voids between the particles and yet control spacing of the coloration components of the particles so as to reduce particle-to-particle refractive interference.

In embodiments, refractive indices of the individual particles may be controlled by a layered composition development or deposition method that provides for a tuning of the colors or the apparent colors of the substantially transparent particles in order that the finished layers may provide a selectively-opaque appearance when viewed (or exposed to incident energy) from an energy/light incident side.

In embodiments involving scattering of light in the visual range, a selectively-opaque appearance may be rendered according to an individual user's desires, while the scattering layers are substantially-transparent to other wavelengths of energy/light passing through the finished layers to areas or sensors behind those finished layers according to tuned refraction of the individual particles. Such structures may allow the formed layers to substantially pass at least 50% to in excess of 80% of the incident light through the layers to impinge upon photovoltaic, energy absorbing light responsive, or light-activated components, energy harvesters, or sensors positioned on a non-light incident side of such layers.

Exemplary embodiments may provide systems, methods, schemes, processes or techniques by which volumes of light scattering particles, suspended in solution or otherwise, may be entrained in an airstream or other gaseous delivery stream for aerosol or aspirated "spray" delivery onto an object or substrate surface.

In embodiments, because the energy/light scattering layers are comprised of substantially-transparent components (particles and fixing matrices), there is virtually no restriction on a particular environment, or to a particular use, in which the layers and/or objects formed of the layers may be operatively deployed for use.

In embodiments, a surface, or surface layer, that appears opaque when viewed from the viewing, observation or light incident side may be made to appear formed of a material of a particular color, or to include a particular pattern, including a multi-color pattern, at the discretion of the user forming the object or object layer.

In embodiments, an appearance of a photocell array, or a thin-film PV layer, may be enhanced by overcoating with a protective layer or film that is particularly arranged to allow an appearance of the photocell array, or thin-film PV layer, to be masked behind the protective layer or film thereby outwardly presenting one or more of a wide range of chosen colors and/or chosen patterns in a manner that does not substantially disrupt or degrade an efficient operation of the photocell array, or thin-film PV layer.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed methods for forming substantially transparent multi-layer micron-sized particles and material compositions including those particles for presentation in a manner compatible to systems and methods for delivering those material compositions to form electromagnetic energy transmissive layers that, once formed, selectively scatter specific wavelengths of electromagnetic energy while allowing remaining wavelengths to pass therethrough, including uniquely implementing optical light scattering techniques in such energy transmissive layers, and with respect to objects, object portions, structural components, foldable/rollable substrates and the like that may benefit from being coated with, formed of or that otherwise incorporate, such transmissive energy-scattering layers, will be described, in detail, with reference to the following drawings, in which:

FIG. 1 illustrates a schematic diagram of an exemplary energy/light scattering surface layer disposed on a structural body member substrate according to this disclosure;

FIG. 2 illustrates a schematic diagram of an exemplary laminated substrate surface energy harvesting component including, as one or more of the laminate layers, a thin-film photovoltaic layer disposed on a substrate, and an energy/light scattering layer according to this disclosure disposed over the thin-film photovoltaic layer;

FIG. 3 illustrates a schematic diagram of an exemplary autonomous component for remote deployment and surveillance scenarios including energy-harvester power, light sensitive (or other physical parameter measuring) sensor elements, processor, data storage and communication capabilities mounted in a structural body member having a surface constituted of a light scattering surface layer according to this disclosure;

FIG. 4 illustrates an exemplary embodiment of a detail of an energy/light scattering layer according to this disclosure;

FIG. 5 illustrates a schematic diagram of an exemplary detail of a substantially transparent multi-layer individual micron-sized particle usable in a light scattering layer according to this disclosure;

FIG. 6 illustrates a schematic diagram of an exemplary assembly line usable for automated forming of energy/light scattering surface layers on structural body members including photocell array layers according to this disclosure; and FIG. 7 illustrates a flowchart of an exemplary method for forming a light-scattering layer, as an autonomous structure, or on some manner of energy harvesting structural body member, having an opaque outward appearance based on inclusion of an energy/light scattering surface layer formed over a photocell layer according to this disclosure.

DETAILED DESCRIPTION OF EMBODIMENTS

The substantially transparent multi-layer micron-sized particles, material compositions in which those particles may be delivered, and the systems and methods for delivery of those material compositions onto substrate surfaces according to this disclosure may include techniques for forming the substantially transparent multi-layer micron-sized particles, techniques for developing material compositions for suspending the formed substantially transparent multi-layer micron-sized particles to facilitate delivery, and may reference delivery systems and techniques for delivery of those material compositions to form electromagnetic energy transmissive layers. These layers, once formed, may selectively scatter specific wavelengths of electromagnetic energy impinging on an energy incident side of the layers, while allowing remaining wavelengths of the electromagnetic energy to pass therethrough. These layers may uniquely implement optical light scattering techniques in such energy transmissive layers. The layers may be applied to objects, object portions, structural components, solid material substrates, foldable/rollable material substrates and the like to produce a selectively colored or designed surface that effectively hides or camouflages electromagnetic (or light) energy activated components placed behind the layers. These layers may be particularly formed to selectively scatter particular wavelengths of electromagnetic energy, including light energy in the visual, near-visual or non-visual range, while allowing remaining wavelengths to pass therethrough with a transmissive efficiency of at least 50%, and up to 80+% with respect to the impinging energy. These layers may uniquely employ optical light scattering techniques in such energy-scattering layers comprised of uniquely-formed substantially transparent multi-layer micron-sized particles that are sized typically on an order of comparable pigment particles found in conventional paints and colorants. Objectives of the disclosed schemes, techniques, processes and methods may further include material build and/or coating techniques for forming objects, object portions, object surfaces, lenses, filters, screens and the like that include, or otherwise incorporate, such transmissive energy scattering layers and/or light scattering layers.

Descriptions of the disclosed systems and methods will refer to a range of real world use cases and applications for energy/light scattering layers, and/or for objects incorporating one or more energy/light scattering layers, that are so formed. These may include, for example, what appear, in use, to be "painted" surfaces, with the distinct difference that the surface treatments allow, rather than block, a substantial portion of the energy impinging on an energy incident side of the produced layers to pass through and to activate, for example, energy activated components underlying the layers.

Exemplary embodiments described and depicted in this disclosure should not be interpreted as being specifically limited to any particularly limiting material composition of the individually-described substantially transparent multi-layer micron-sized particles, and the matrices in which those particles may be suspended, except as indicated according to the material properties generally outlined below. Further, the exemplary embodiments described and depicted in this disclosure should not be interpreted as specifically limiting the configuration of any of the described layers or of structures, objects, object portions, object surfaces, substrates, articles of manufacture or component sections thereof. Finally, references will be made to individual ones, or classes, of energy/light collecting sensor components and energy/light activated devices that may be operationally mounted in, installed in or placed behind the disclosed energy/light scattering, light directing or light transmissive layers so as to be hidden from view when an object including such sensor components or devices is viewed from a viewing, observation or light incident outer surface of the object or layer, from which perspective the energy/light scattering, light directing or light transmissive layers may appear "opaque" to the incident electromagnetic energy. These references are intended to be illustrative only and are not intended to limit the disclosed concepts, compositions, processes, techniques, methods, systems and devices in any manner. It should be recognized that any advantageous use of the disclosed schemes for preparing the disclosed particles, suspending those particles in a delivery matrix, and forming energy/light transmissive, light directing and/or light scattering layers, and objects formed of, or otherwise incorporating, such layers to effect an aesthetically consistent, or aesthetically pleasing, outward appearance of the object or layer while allowing particularly visible, or near-visible, light components to pass through, employing systems, methods, techniques, and processes such as those discussed in detail in this disclosure is contemplated as being included within the scope of the disclosed exemplary embodiments.

The disclosed systems and methods will be described as being particularly adaptable to hiding certain light-activated devices and sensors, and certain photovoltaic materials, cells or photocells (generally referred to below collectively as "photocells"), and an emerging class of increasingly efficient thin-film photovoltaic ("TFPV") materials or material layers, which are typically mils thick, on the surfaces of or within objects, behind layers that may appear opaque from a viewing, observation or light incident side. As used throughout the balance of this disclosure, the term "photocell" will be employed as shorthand and intended to reference, without limitation, broad classes of light-activated, light-absorbing light-employing, or otherwise operationally light-involved surfaces or components in which a photoelectric, photoconductive or photovoltaic effect is advantageously employed to produce a current or voltage when exposed to light (in a visual or near-visual range of the electromagnetic spectrum), or other selected electromagnetic radiation. These references also incorporate TFPV materials and material layers. Those of skill in the art recognize that photocells may be alternatively referred to as photoelectric cells, photovoltaic cells, or photoconductive cells, and more colloquially in certain implementations as "electric eyes." The generic use of the term photocell in this disclosure encompasses, without limitation, all of these terms as well.

Photocells are typically covered in silica crystalline, amorphous, thin-film, organic or other light directing layers. These light directing layers work by implementing scattering and/or plasmonic effects in which light absorption is improved generally by scattering light using metal nanoparticles excited at a surface plasmon resonance of those nanoparticles. Surface plasmon resonance or SPR generally refers to a resonant oscillation of conduction electrons at an interface between a negative and positive permittivity material when stimulated by incident light. A resonance condition is established when the frequency of incident photons matches a natural frequency of surface electrons oscillating against a restoring force of positive nuclei.

In embodiments according to this disclosure, unique and advantageous light directing layers scatter a small portion of an impinging light spectrum back in a direction of an observer on a viewing, observation or light incident side of the light directing layer. In this manner, a particular light directing layer may appear to have a particular color in the visual spectrum, while a substantial portion (at least 50% and up to 80+%) of the light energy permissibly passes through the thin light directing layer impinging on an operative surface of the underlying photocell to produce electricity according to the photoelectric effect.

Reference may be made to the disclosed energy/light transmissive layers, energy/light scattering layers and/or energy/light directing layers, as these terms may be interchangeably used in the context of this disclosure, being particularly usable to aesthetically hide photocells. It should be recognized, however, that the disclosed layers may be equally effective in employment scenarios, and/or use cases in which other sensors, including some form of camera or imaging device or lens positioned behind such a layer, may be usable for observation of a space or area. A capacity of such a camera or imaging device to be usable in substantially all lighting conditions may be limited only by a capability of the camera or imaging device itself, and not limited based on any failure of the light scattering layer behind which the camera or imaging device is placed to be substantially-transparent with respect to the camera or imaging device. While the disclosed light-scattering layers do not produce a completely transparent lens through which images are captured, filtering may be applied between the layer and the lens to render the captured images adequate to many surveillance scenarios. A position of such a camera or imaging device behind the light scattering layer may be substantially "hidden," or otherwise camouflaged, as may, in like manner, be a position of any number of light actuated detection, sensor or other device components. In this regard, general reference to the use of the disclosed energy/light scattering layers, or objects formed of those energy/light scattering layers, as embedding photocells should not be considered as limiting the disclosed systems and methods to any particular set or class of light-activated or light employing sensors. Further, while general reference will be made to "light scattering" effects, these references are not intended to exclude energy scattering in other portions of the electromagnetic spectrum to which certain energy scattering layers may be made to appear opaque to particular wavelengths of non-visible radiation.

Additionally, reference to any particularly useful compositions of the materials from which the disclosed substantially transparent multi-layer micron-sized particles, which may be generally spherical, may be formed are also descriptive only of broad classes of input materials that may be presentable in generally transparent, or seemingly transparent, particle form. Suitable materials for such particles may be discussed specifically according to their composition, or may be more broadly referred to by certain functional parameters (including variable refractive indices), neither of which should be considered to limit the broad scope of available input materials of which such particles may be formed. Typical particle sizes may be on an order of 5 microns or less, and thus comparable in size to pigment particles typically found in paints or colorants. See Table 1 below.

TABLE 1

| average pigment particle size | | |
|---|---|---|
| microns | meters | representative pigments |
| 50 μm | | smallest particles visible without magnification<br>cobalt violet<br>manganese blue |
| 10 μm | $10^{-5}$ | cobalt green<br>cobalt turquoise<br>cerulean blue |

TABLE 1-continued

| average pigment particle size | | |
|---|---|---|
| microns | meters | representative pigments |
| 5 μm | | manganese violet<br>black iron oxides<br>ultramarine blue (RS)<br>viridian<br>cobalt blue<br>violet (brown) iron oxides<br>yellow iron oxides |
| 1 μm | $10^{-6}$ | ultramarine blue (GS)<br>red iron oxides<br>cadmium red<br>cadmium orange<br>semiopaque synthetic organics<br>diarylides<br>pyrroles<br>naphthols<br>perinone orange |
| 0.5 μm | | = 500 nanometers<br>= wavelength of "blue green" light<br>chromium oxide green<br>cadmium yellow<br>bismuth yellow<br>titanium white<br>transparent red iron oxides<br>transparent yellow iron oxides<br>semitransparent synthetic organics |

Note:
Particle measurements are approximate and represent the average of a distribution of pigment grades/sizes quoted here are representive of modern artist's pigments. All pigment particles tend to clump into aggregates or agglomerates, which may be 5 to 50 times larger than the sizes listed here.
Sources: *Handbook of Industrial Chemistry* (1999); Gettens & Stout, *Painting Materials* (1956); *Artists' Pigments* (1996-2005); Kremer Pigments; manufacturer data.

Figure 5:
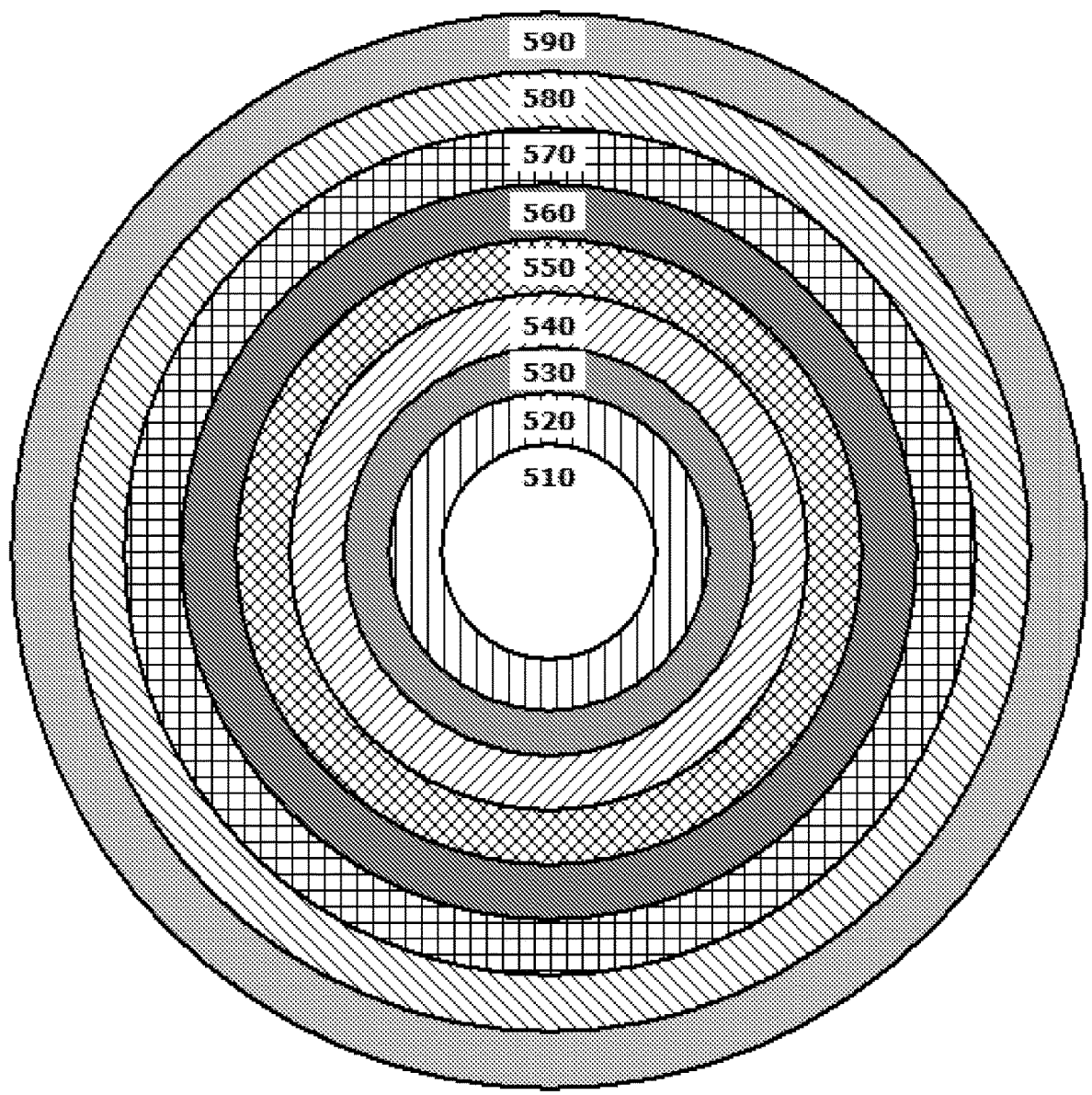

As will be described in greater detail below with, for example, reference to FIG. 5, the disclosed particles may each comprise a spherical core or nucleus, and as many as 30+ layers surrounding that core or nucleus to achieve the particular control of the refractive index of each of the particles in the manner indicated in this disclosure. The composition of the substantially transparent multi-layer micron-sized particles will be controlled generally depending on wavelength of the incident energy that is intended to be scattered by the energy scattering layer comprising the particles. Table 2 refers to ranges of wavelengths for the differing colors in the visible light spectrum.

TABLE 2

| Color | Wavelength | Frequency | Photon energy |
|---|---|---|---|
| violet | 380-450 nm | 668-789 THz | 2.75-3.26 eV |
| blue | 450-495 nm | 606-668 THz | 2.50-2.75 eV |
| green | 495-570 nm | 526-606 THz | 2.17-2.50 eV |
| yellow | 570-590 nm | 508-526 THz | 2.10-2.17 eV |
| orange | 590-620 nm | 484-508 THz | 2.00-2.10 eV |
| red | 620-750 nm | 400-484 THz | 1.65-2.00 eV |

Typical dielectric matrices in which such particles may be stabilized will be described. These may include binder or matrix materials that may be generally comprised of synthetic or natural resins, such as alkyds, acrylics, vinyl-acrylics, vinyl acetate/ethylene (VAE), polyurethanes, polyesters, melamine resins, epoxy, silanes or siloxanes or oils. Any reference to a particular transparent dielectric material to promote the stabilization or fixing of the particles in layer form is intended to be illustrative and non-limiting.

An advantage of the compositions described in this disclosure over those described in the 143 and the 145 applications is that the composition of the substantially transparent multi-layer micron-sized particles themselves renders them amenable to suspension in a broader range of matrix or suspension formulations.

In embodiments, an object, outer surface coating for an object, and/or outer film may be provided that is designed to allow a wide range of chosen colors to be presented to an observer from a viewing, observation or light-incident side of the object while substantially maintaining an efficiency of any embedded sensor or photocell as though covered by any essentially clear, light transparent covering, coating or protective outer layer.

In embodiments, virtually any total or partial object surface may be modified such that photocells or other sensors and devices associated with the object surface may be completely masked or camouflaged. A roof on a structure, for example, may be covered by photocells or TFPV, but still have an appearance of a typical shingled, tiled, metal, tarred or other surface-treated roof. Separately, a portion of a wall of a structure, internal or external, could be embedded with photocells or covered with TFPV, while maintaining an appearance of a painted surface, a textured surface, or even a representation of a particularly-chosen piece of artwork, based on being over sprayed with a light-scattering layer including transparent particles having selective refractive indices suspended in compatible matrices for delivery, including by spraying over the photocells or TFPV. Vehicles, including automobiles and/or buses, may be provided with photocells or TFPV on various outer surfaces, the photocells being masked by overcoats of the light directing and/or light scattering layers so as to render the affected surfaces as appearing to consist of nothing more than normal, painted surfaces.

Outer surface layers of structures, vehicles or objects may incorporate a plurality of different sensors that are masked or camouflaged so as to be visibly undetectable, or in a manner that is aesthetically correct, pleasing or required according to restrictions in an operating environment or use case. In this regard, a required or desired appearance of an outer layer of a structure or structural component may be preserved, while providing advantageous use of a light transmissive property of an object or object surface layer to promote illumination of an area behind, beyond, under, or around the object or object surface that maintains the conventional or desired appearance.

Solid object body structures, hollow object body structures, or other object surface layers may be produced that are colorizable, or visually texturizable, without the use of pigments, paints, inks or other surface treatments that merely absorb certain wavelengths of light. The disclosed energy/light scattering layers allow determined visible, near-visible or non-visible wavelengths of energy/light to pass through the layers substantially unimpeded, while scattering other determined visible, near-visible or non-visible wavelengths of energy/light thus, in the case of visible light scattering, for example, producing a colorized look to the surface of the objects that include or incorporate the energy/light scattering layers.

FIG. 1 illustrates a schematic diagram 100 of an exemplary object energy/light scattering surface layer 110 disposed on a transparent portion of a body structure 120. As shown in FIG. 1, the energy/light scattering layer 110 is configured to allow first determined wavelengths of energy/light, WLp, to pass through the energy/light scattering layer 110. The configuration of the energy/light scattering layer 110 simultaneously causes certain second determined wavelengths of energy/light, WLs, to be scattered back in an incident direction substantially as shown.

As is noted above, and as will be described in greater detail below, the energy/light scattering layer 110 may be configured of substantially transparent multi-layer micron-sized particles of varying sizes, substantially in a range of 5 microns or less. The substantially transparent multi-layer micron-sized particles may be stabilized in structural or other layers further comprised of substantially-transparent matrix materials including, but not limited to, dielectric materials. An ability to configure the substantially transparent multi-layer micron-sized particles to "tune" the light scattering surface of the light scattering layer 110 to scatter particular second determined wavelengths of energy/light, WLs, may provide the capacity of the energy/light scattering layer 110 to produce a desired visual appearance in a single color, multiple colors, or according to an image-wise visual presentation provided by the energy/light scattering layer 110. Put another way, depending on a particular composition of the substantially transparent multi-layer micron-sized particles comprising the energy/light scattering layer 110 (or multiple layers), one or more colors, textures, color patterns, or color-patterned images may be visually produced by the energy/light scattering layer 110.

In cases where the incident energy includes wavelengths in the visual spectrum, refractive indices of the energy/light scattering layer 110 may be selectively tuned based on structural compositions of the substantially transparent multi-layer micron-sized particles. In embodiments in which the energy/light scattering layer 110 is intended to appear as a single color across a surface of the energy/light scattering layer 110, the composition of the particle and matrix scheme across the surface of the energy/light scattering layer 110 may be substantially identical, or homogenous. In embodiments in which the light scattering layer 110 is intended to appear in multiple colors, multiple textures, or as an imaged surface, the composition of the particle and matrix scheme across the surface of the energy/light scattering layer 110 may be varied, particularly employing differently configured (or colored) substantially transparent multi-layer micron-sized particles to present surface layer portions with differing refractive indices thereby appearing as different colors when viewed from a light-incident side of the energy/light scattering layer 110.

A light scattering effect of the energy/light scattering layer 110 may be produced in response to illumination generally from ambient light in a vicinity of; and/or impinging on, the surface of the energy/light scattering layer 110. Alternatively, the light scattering effect of the energy/light scattering layer 110 may be produced in response to direct illumination generally produced by some directed light source 130 focusing illumination on the light-incident surface of the energy/light scattering layer 110.

In the general configuration shown in FIG. 1, the energy/light scattering layer 110 is formed over the transparent body structure 120 in a manner that allows the first determined wavelengths of energy/light, WLp, to pass not only through the energy/light scattering layer 110, but also to pass further through the transparent body structure 120 in a substantially unfiltered manner that, in a case of light in a visual range, allows an area or light-activated sensor positioned in, under, or behind the transparent body structure 120, or behind the energy/light scattering layer 110 and, for example, embedded in the transparent body structure 120, to be illuminated by the first determined wavelengths of energy/light, WLp, as though those first determined wavelengths of energy/light, WLp, may have been otherwise caused to pass substantially unfiltered through a glass, plastic, or other transparent outer covering or protective layer. In this manner, the first determined wavelengths of energy/light, WLp, passing through the energy/light scattering layer 110, and the transparent body structure 120, may provide significant light energy to simply illuminate an area shadowed by the transparent body structure 120, or to be employed as appropriate by any manner of light detection component, including any light-activated, light-absorbing light-employing, or otherwise operationally light-involved sensor positioned in or behind all or a portion of the transparent body structure 120. In embodiments, a thickness of the body structure 120 may be reduced to substantially a thickness of the energy/light scattering layer 110.

Figure 2:
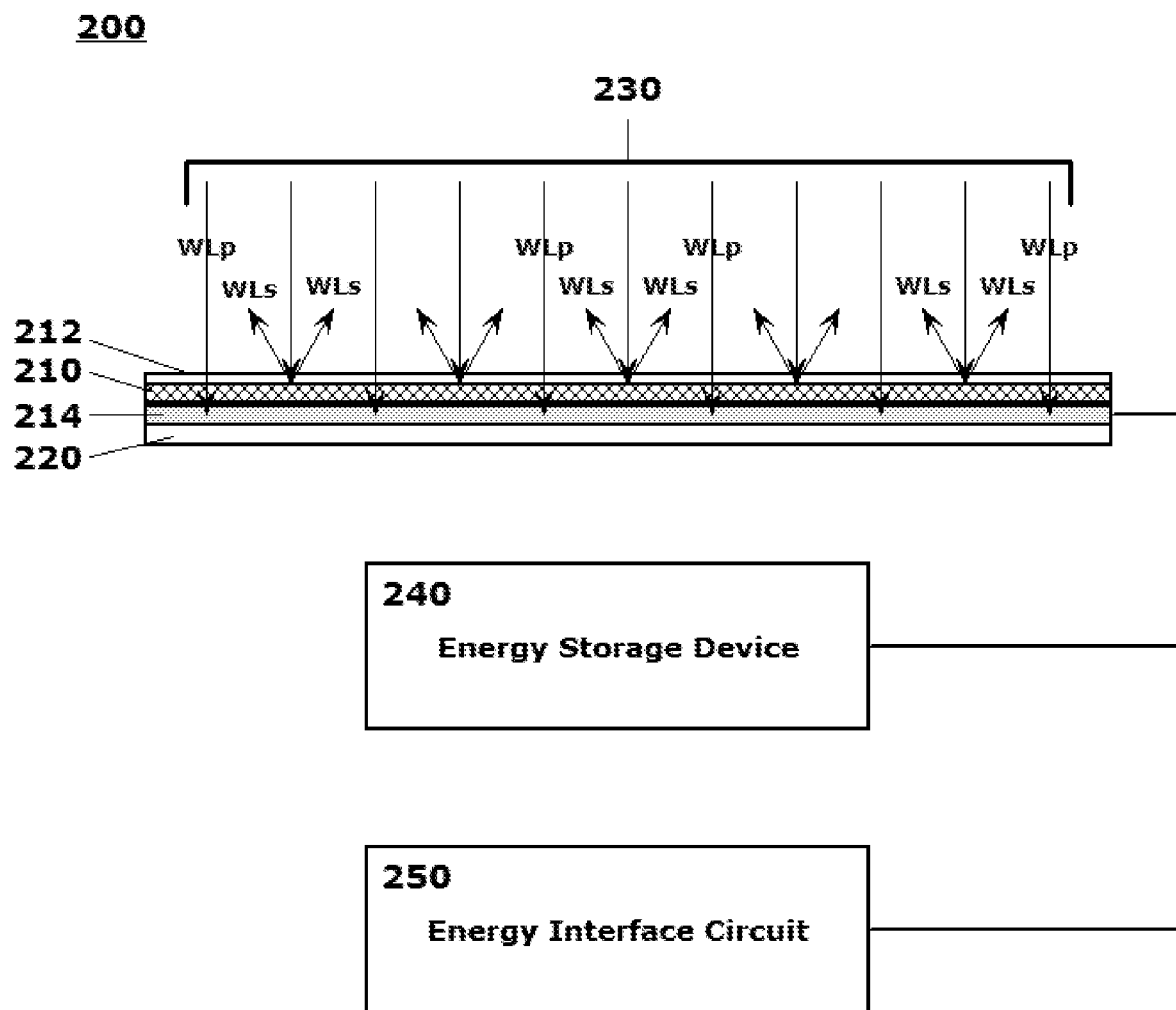

FIG. 2 illustrates a schematic diagram 200 of an exemplary laminated substrate surface energy harvesting component including, as one or more of the laminate layers, a thin-film photovoltaic layer disposed on a substrate, and an energy/light scattering layer according to this disclosure disposed over the thin-film photovoltaic layer. As shown in FIG. 2, the ambient energy/light in a vicinity of the energy/light scattering layer 210, or the energy/light directed from an energy/light source 230 at the energy/light scattering layer 210, may pass through a clear overlayer 212, which may be in the form of a clear protective layer. The clear overlayer 212 may be formed of a glass, a plastic, another energy/light transparent composition (such as a clear coat) and/or of a material from which a transparent body structure may be substantially formed. The energy/light scattering layer 210 may be configured to operate in a same manner as the energy/light scattering layer described above with reference to FIG. 1. At least first wavelengths of energy/light, WLp, may pass through the energy/light scattering layer 210, while at least the second wavelengths of energy/light, WLs, may be scattered back in the incident direction in the manner described above.

The at least first wavelengths of energy/light, WLp, may impinge on a TFPV material layer 214 that may be disposed on, or adhered to, a surface of a substrate 220. The at least first wavelengths of energy/light, WLp, impinging on the TFPV material layer 214 may cause the TFPV material layer 214 to generate electrical energy, which may be stored in a compatible energy storage device 240, and/or output via a compatible energy interface circuit 250 to deliver the generated electrical energy to downstream components or loads (not pictured).

Figure 3:
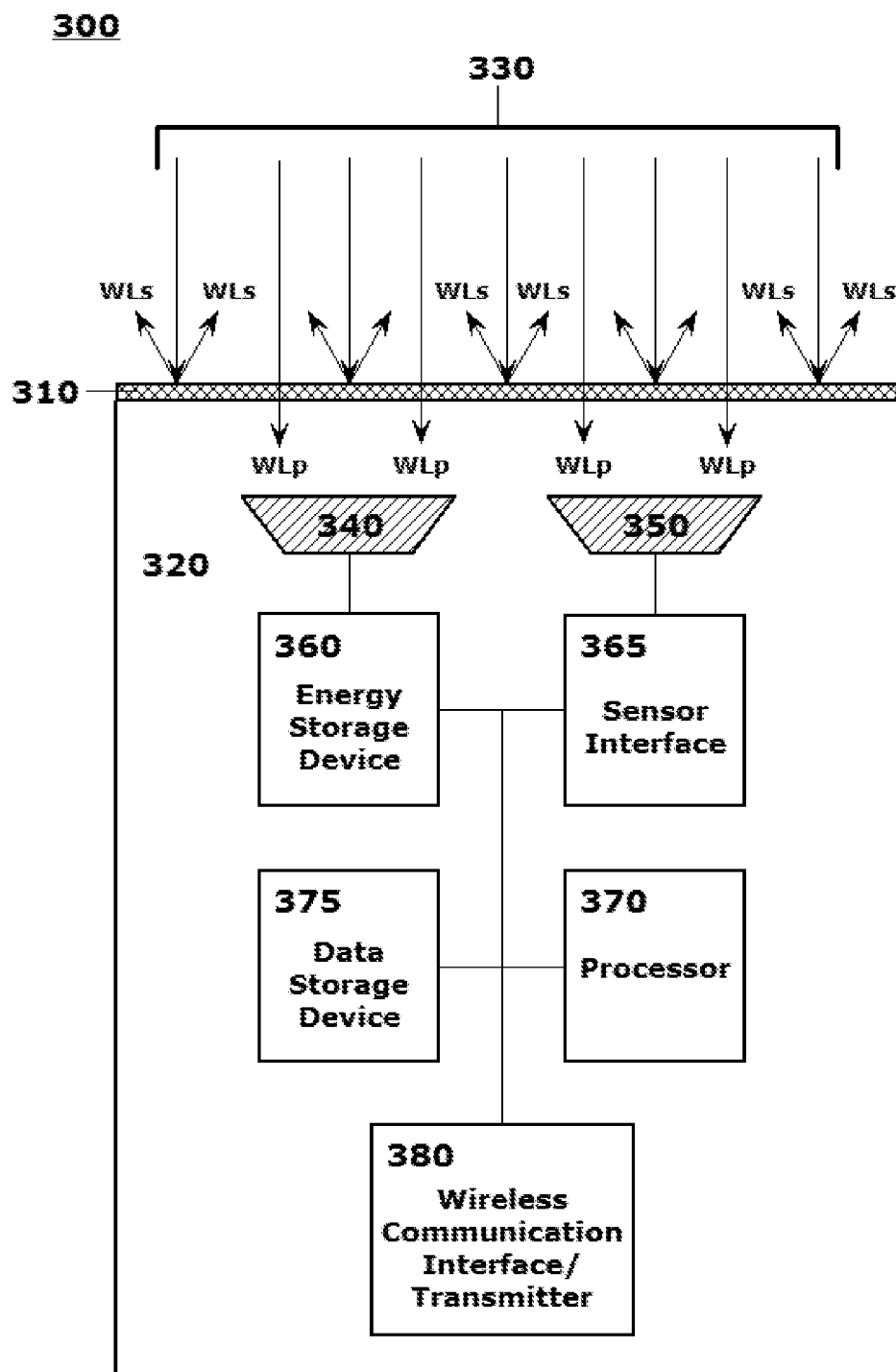

FIG. 3 illustrates a schematic diagram 300 of exemplary autonomous component that may be usable for remote deployment and surveillance scenarios including an energy-harvester power element 340, a light sensitive (or other physical parameter measuring) sensor element 350, a processor 370, a data storage device 375 and communication capabilities mounted in a structural body member 320 having a surface constituted of a light scattering surface layer 310 according to this disclosure. As shown in FIG. 3, at least first determined wavelengths, WLp, of the ambient light in a vicinity of the light scattering layer 310, or of light directed from a light source 330 at the light scattering layer 310, may pass through the light scattering layer 310, in the manner described above with reference to the embodiment shown in FIGS. 1 and 2, while at least second determined wavelengths, WLs, of the ambient light, or the directed light, may be scattered back in the incident direction in the manner described above.

The at least first wavelengths, WLp, of the ambient light, or the directed light, may be caused to impinge on a facing or facial surface of the exemplary an energy-harvester power element 340, which may be in a form of a photocell or a TFPV material covered component. The at least first wavelengths of energy/light, WLp, impinging on an energy-harvester power element 340 may cause the energy-harvester power element 340 to generate electrical energy which may be stored in a compatible energy storage device 360 allowing the combination of the energy-harvester power element 340 and the compatible energy storage device 360 to power other components in the exemplary autonomous component.

The at least first wavelengths, WLp, of the ambient light, or the directed light, may be caused to impinge on a facing or facial surface (or a lens) of an exemplary light sensitive sensor element 350. At least the first wavelengths, WLp, of the ambient light, or the directed light, may cause the exemplary light sensitive sensor element 350 to generate a particular output signal, which may be output directly, or via some manner of sensor interface 365, to a processor 370 for signal processing.

The first wavelengths of energy/light, WLp, impinging on the exemplary light sensitive sensor element 350 may be conditioned through one or more energy/light focusing/filtering layers that may be in a form of optical isolators, prisms, lenses or the like, and that may focus, filter or otherwise condition the first wavelengths of energy/light, WLp, as may be appropriate to modify an input of the energy to the exemplary light sensitive sensor element 350 to be compatible with the capabilities, or input requirements, of the exemplary light sensitive sensor element 350, particularly when provided in the form of a camera and/or other imaging device. Those of skill in the art will recognize that the first wavelengths of energy/light, WLp, may require minor modification and/or re-filtering to be rendered compatible.

In embodiments, the first wavelengths of energy/light, WLp, may also or otherwise be partially blocked from further transmission to and through the transparent body structure 320 by one or more opaque, near opaque, or darkened energy/light shades, which may be in a form of solid object body components. The energy/light shades may substantially shield or shadow portions of the transparent body structure 320, and any area or sensor placed behind the energy/light scattering layer 310 in the transparent body structure 320 from exposure to the first wavelengths of energy/light, WLp. Energy/light filtering layers (or elements) and energy/light shades may be arranged in any configuration to function exclusively, or otherwise to function cooperatively, to control and/or otherwise direct the transmission of the first wavelengths of energy/light, WLp, through the transparent body structure 320 to one or both of the energy-harvester power element 340 and the exemplary light sensitive sensor element 350.

The data storage device 375 may be provided to store operating programs to be referenced by the processor 370 in carrying out functional control of the exemplary autonomous device. Separately, the data storage device 375 may be provided to at least temporarily store information obtained via the exemplary light sensitive sensor element 350, and as may be modified by the sensor interface 365.

A wireless communication capability may be provided with the inclusion of a wireless communication interface/transmitter 380, which may be in a form of a low-power radio or satellite communication transmitter operating according to any one or more of a number of wireless communicating protocols, including such protocols as may be usable to cause the exemplary autonomous device to communicate with similarly situated autonomous devices to form an ad hoc wireless communication mesh network between such similarly situated autonomous devices. As indicated, the wireless communication interface/transmitter 380 may operate according to any compatible wireless signal processing protocol including, but not limited to, Wi-Fi, WiGig, Bluetooth®, Bluetooth® Low Energy (LE) (also referred to as Bluetooth® Smart or Version 4.0+ of the Bluetooth® specification), ZigBee®, or other similar wireless signal processing protocol for communication of wireless signals to appropriate local or remote compatible receivers.

Figure 4:
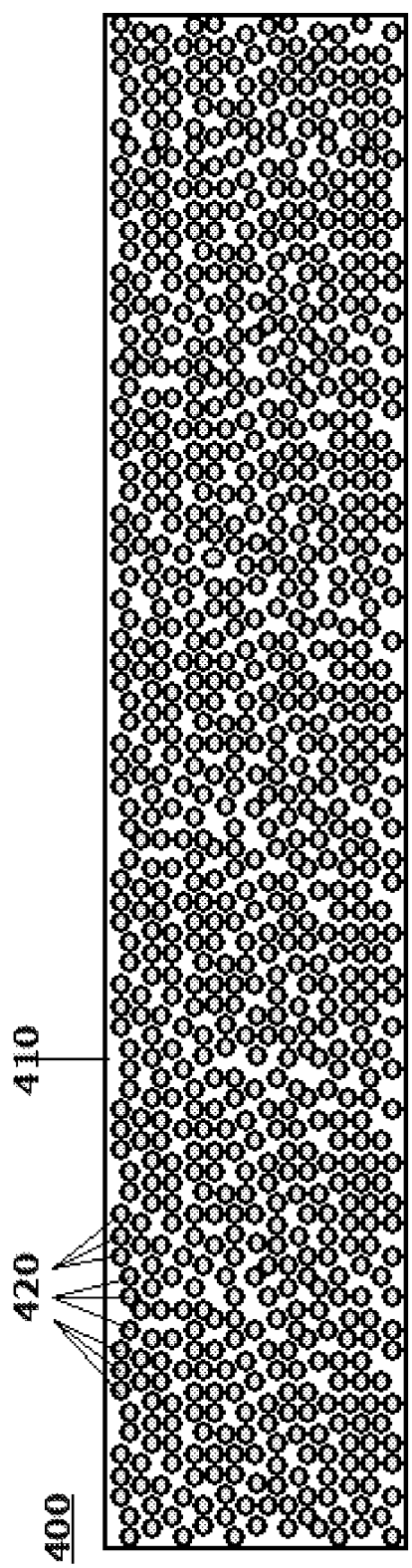

FIG. 4 illustrates an exemplary embodiment of a detail of an energy/light scattering layer 400 according to this disclosure. The disclosed schemes, processes, techniques or methods may produce an energy/light scattering layer 400 created using substantially transparent multi-layer micron-sized particles 420 in range of diameters of 5 microns or less embedded in a substantially-transparent dielectric matrix 410. As an example, the substantially transparent multi-layer micron-sized particles 420 may include titanium dioxide nanoparticles in a layered form as described below with regard to FIG. 5. Titanium dioxide is widely used based on its brightness and comparatively high refractive index, strong ultraviolet (UV) light absorbing capabilities, and general resistance to discoloration under exposure to UV light.

In earlier experimentation with similar energy/light scattering layers, colorations of the layered materials were achieved through combinations of (1) material compositions of the particles, (2) material compositions of the binders, (3) nominal particle sizes, (4) nominal particle spacings, and (5) interplay between any or all of those material factors. That "interplay" was important. To any extent that those layers could be randomly formed, there had to be some order to that randomness in order to achieve consistent results. In the substantially transparent multi-layer micron-sized particles according to this disclosure, the only variables to be controlled are particle size and/or physical composition. Embodiments of the disclosed substantially transparent multi-layer micron-sized particles are layered, and considered as a unit. There is no requirement for constituent interplay between the particles and the binder. The binder just holds the particles where they land, and spacing between the particles is rendered based on a clear, neutral outer coating on the substantially transparent multi-layer micron-sized particles. These modifications provide broader latitude in the use of randomized delivery methods, including spray delivery of an aspirated composition of non-pigment particulate material suspended in a comparatively transparent or relatively clear binder material. Aspirated and aerosol delivered solvent suspended particulate material cannot necessarily be controlled in its delivery, so the composition of the disclosed substantially transparent multi-layer micron-sized particles addresses that issue.

FIG. 5 illustrates a schematic diagram 500 of an exemplary detail of a substantially transparent multi-layer individual micron-sized particle usable in a light scattering layer according to this disclosure. The substantially-transparent micron-sized particles of the disclosed embodiments are comprised of layered constructions as shown. It is anticipated that the particle shape will be nominally spherical. A core sphere 510 may have a diameter to accommodate an optical path length through the core of approximately one half wavelength of light for the color of interest. See Table 2 above. The multi-layer structure surrounding the core sphere 510 may be comprised of 15 or more individual material layers 520-580, each having a thickness to accommodate an optical path length through the layer of one quarter wavelength of light for the color of interest. For individualized colors from blue to red this layer-on-layer construction surrounding the core sphere 510 may result in an overall particle size of from about 1.9 microns up to 2.6 microns. With reference again to Table 1 above, this range of overall particle sizes for the multi-layered construction of the transparent spheres is comparable to the typical ranges of diameter of paint pigment particles. In other words, the disclosed substantially transparent multi-layer micron-sized particles fit well within the normal range for paint pigment sizes at the upper end of the distribution for aerosol application of paint.

Apparent colors, patterns or images of light scattering layers may be produced by adjusting refractive indices of the particles according to a size of the spherical core 510 of the particles and the layers 520-580 of material deposited on the spherical core 510 of the particles. Apparent solid colors may be produced by presenting a substantially homogenous layer of single-color particles across a light incident surface of the light scattering layer. Patterns may be produced by appropriately varying the adjustment of the refractive indices of the particles by manipulating the sizes of the spherical cores and accompanying outer layers of the particles and mixing varying colored particles across the light incident surface of the light scattering layer, in a manner that may be similar to mixing paint colors in an image-wise variation across a substrate surface.

Each layer 520-580 may exhibit a consistent index of refraction for primary color particles, or different indices of refraction to vary the colors consistently in the layered structure of the particles. The number of particle layers may be varied over a range required by a particular application and/or use case. Such a particle composition allows for additional degrees of freedom in adjusting the color, transmission and scattering, i.e., in "tuning" the energy/light scattering effects produced by the composition of the energy/light scattering layer. Typically, an outer layer 590 will be formed of a neutral, substantially transparent, often dielectric material of a thickness selected to provide a minimum required separation between the "colorant" layers of the substantially transparent multi-layer micron-sized particles to reduce instances of refractive interference thereby causing variation in the color presentation provided by the light scattering layer.

As employed according to the disclosed schemes, titanium dioxide may be presented as a substantially-transparent semiconductor material with a wide band gap (Eg=3.2-3.4 (eV)) and a high refractive index (n=2.5-2.9). These characteristics allow the titanium dioxide to be used in conjunction with substantially transparent metal dielectric composites designed to obtain, or otherwise control, desired optical properties of the energy/light scattering layer in the visible, and near-visual, light range. Titanium dioxide should, therefore, be considered to represent an example of dielectric material from which the transparent core sphere 510 and the transparent layers 520-580 may be formed.

For finding suitable materials for the core and layers, the optical bandgap may be referenced in conjunction with the material processing requirements to ensure that the precise dimensional control described above is possible. Processing requirements of the layers must be compatible to avoid degradation. Typical band gap values for certain materials are comparatively shown in Table 3 below. Diamond is clear with a high optical band gap and silicon has a low bandgap and is basically black.

TABLE 3

| Group | Material | Symbol | Band gap (eV) @ 302 K |
|---|---|---|---|
| IV | Diamond | C | 5.5 |
| IV | Silicon | Si | 1.11 |
| IV | Germanium | Ge | 0.67 |
| III-V | Gallium nitride | GaN | 3.4 |
| III-V | Gallium phosphide | GaP | 2.26 |
| III-V | Gallium arsenide | GaAs | 1.43 |
| IV-V | Silicon nitride | $Si_3N_4$ | 5.0 |
| IV-VI | Lead sulfide | PbS | 0.37 |
| IV-VI | Silicon dioxide | $SiO_2$ | 9 |
| | Copper oxide | $Cu_2O$ | 2.1 |

Referencing the photon energy values in Table 3, materials selection for the particle cores and layers may be according to Table 4, the criterion being that the optical band gap exceeds the photon energy of light in the color of interest.

TABLE 4

| Group | Material | Formula | Band gap (eV) |
|---|---|---|---|
| IV | Diamond | C | 5.47 |
| IV | Silicon carbide, 4H-SiC | SiC | 3.3 |
| IV | Silicon carbide, 6H-SiC | SiC | 3.0 |
| VI | Sulfur, a-S | $S_8$ | 2.6 |
| III-V | Boron nitride, cubic | BN | 6.36 |
| III-V | Boron nitride, hexagonal | BN | 5.96 |
| III-V | Boron nitride nanotube | BN | ~5.5 |
| III-V | Boron arsenide | $B_{12}As_2$ | 3.47 |
| III-V | Aluminium nitride | AlN | 6.28 |
| III-V | Aluminium phosphide | AlP | 2.45 |
| III-V | Gallium nitride | GaN | 3.44 |
| III-V | Gallium phosphide | GaP | 2.26 |
| II-VI | Cadmium sulfide | CdS | 2.42 |
| II-VI, oxide | Zinc oxide | ZnO | 3.37 |
| II-VI | Zinc selenide | ZnSe | 2.7 |
| II-VI | Zinc sulfide | ZnS | 3.54/3.91 |
| II-VI | Zinc telluride | ZnTe | 2.25 |
| I-VII | Cuprous chloride | CuCl | 3.4 |
| Oxide | Titanium dioxide, anatase | $TiO_2$ | 3.2 |
| Oxide | Titanium dioxide, rutile | $TiO_2$ | 3.02 |
| Oxide | Titanium dioxide, brookite | $TiO_2$ | 2.96 |
| Oxide | Tin dioxide | $SnO_2$ | 3.7 |
| Oxide | Barium titanate | $BaTiO_3$ | 3 |
| Oxide | Strontium titanate | $SrTiO_3$ | 3.3 |
| Oxide | Lithium niobate | $LiNbO_3$ | 4 |
| Magnetic | Nickel(II) oxide | NiO | 3.6-4.0 |

As discussed in detail in the 143 and 145 applications, colors of composites containing noble metal inclusions may be tuned based on surface plasmon resonance (SPR) for the composites in the metallic phase. Light scattering layers comprising films with well separated embedded metallic nanoparticles, in dimensions smaller than the wavelengths of the exciting light, may be characterized by a peak in the visible range of the absorption spectra. An ability to control the refractive indices of the substantially transparent multi-layer micron-sized particles by carefully applying layers 520-580 to be one quarter wavelength in thickness according to the color of interest intended to be represented allows tuning of the optical properties of the substantially transparent multi-layer micron-sized particles suspended in a matrix as composite material from which the light scattering layer may be formed.

Particle size is related to the wavelength of interest, in the manner described above, in order to determine the color of the substantially transparent multi-layer micron-sized particles. Spacing between the particles is related to the size in order to reduce interference between the refractions of separate particles. The binder index of refraction has to be different from the particle index of refraction. Because where there is a difference in index of refraction (according to Snell's Law), a reflection occurs. When two reflections are spaced properly, the interaction of multiple reflections is what provides the color.

The outer layer 590 may be configured to ensure that the colorant producing layers of the particles are kept separated. In an instance in which the colorant producing layers touch, no interaction reflection is generated. A result of a configuration of a particle according to this scheme is a particle that acts in a form of a Bragg Reflector. Multiple weak reflections of a same wavelength reinforce each other resulting in a strong reflection of a particular wavelength based on the particle size, which determines the particle spacing, and the index of refraction also determines the speed of light which in turn describes the optical wavelength. A number of particles per unit volume of solvent (matrix material) essentially ensures that the particles always touch.

According to the above particle formation scheme, the entire combined characteristic structure necessary to make the coloration work is collected into a single multi-layered spherical structure. Put another way, each single one of these substantially transparent multi-layer micron-sized particles has all of the features necessary to make the coloration, including the characteristics of the layers, necessary particle spacing, and controllable indices of refraction.

There are only now two key components/concerns, once the entire distribution structure is formed into a single sphere: (1) there will be an interaction between an index of refraction of the binder or matrix material and an index of refraction of an outermost layer of the multi-layered spherical structure; and (2) a thickness of the outermost layer of the multi-layered spherical structure must be particularly controlled to ensure that a proper spacing is maintained by the colorant component layers of the substantially transparent multi-layer micron-sized particles in order to ensure that there is no optical interaction between the colorant component layers of the adjacent substantially transparent multi-layer micron-sized particles. This outermost layer will typically be thicker than the underlayers of which the substantially transparent multi-layer micron-sized particle is comprised in order to attempt to ensure that safe separation is maintained.

If the outermost layer is controlled to be composed of a material that is at a same index of refraction as the binder or matrix material, the outermost layer does not do anything in interaction with the binder or matrix material. The outermost layer will be transparent, and maintain that transparency when immersed in the substantially-transparent binder or matrix material having a same index of refraction as the outermost layer of substantially transparent multi-layer micron-sized particles. In this manner, the outermost layers, in their composition and thickness, provide the essential interstitial spacing between the colorant components so as to assure color fidelity. The layers thus formed will yield only the color that is "built in" to the substantially transparent multi-layer micron-sized particles according to the structure of the color yielding/generating underlayers inward of the outermost layer in the manner described below.

With enough layers, in a range of 10 to 15, to as many as 30 layers, color concentration would be high enough in each of the particles so as to not require external coloration reinforcement provided by adjacent multi-layer particles. The outer layers are comparatively clear, as is the binder or matrix solution, and preferably having a comparatively same index of refraction as between the material forming the outer layers and the material forming the binder solution. This is to ensure that there is no interaction between the particles in the binder, and no interaction between the particles, specifically the color yielding/generating components of the particles over a longer distance. The outer layers may be comparatively, e.g., 10 times the thickness of each of the underlying dielectric layers.

The disclosed substantially transparent multi-layer micron-sized particles may be formed in a very tightly-controlled particle build process. A spherical core may be formed in a material or layer deposition process such as, for example, an atomic layer deposition (ALD) process, to achieve the substantially transparent multi-layer micronsized particles according to the disclosed schemes. Particle deposition control systems exist that can be scaled to produce these substantially transparent multi-layer micronsized particles. Quality control in the particle build process produces the necessary level of color consistency. There are, however, deposition processes that can be controlled to the units of nanometers thicknesses.

Yield, time and costs will all be interrelated depending on the precision of the particle build process. When highest levels of color precision (repeatability) are required, the precision with which those particles need to be manufactured is high, with lower yield over a longer time and at a higher cost. When the precision in the repeatable coloration can be less precise such as, for example, in building materials as opposed to automotive finishes, higher yields are available over shorter times at comparatively lesser cost. Put another way, higher yields will be available in shorter times and the cost of throughput of particles per pound will be comparatively lower.

The physical thickness (diameter) of the sphere will be adjusted per the index of refraction of the material(s) from which the sphere is formed to give the correct optical path length. This distinction between a physical diameter, and an optical path length (or diameter), is adjusted by the index of refraction of the material of which the sphere is formed. In a vacuum, the physical diameter and the optical diameter would be the same as the index of refraction in the vacuum is 1. The index of refraction of typical glass, for example, is in a range of approximately 1.4-1.5. As such, the physical thickness will be adjusted based on an index of refraction in order to achieve a particular wavelength of light based on the material employed.

Uniformity with respect to an optical path length is paramount and is controlled so that a thickness of the layers surrounding the core will have a thickness so that, according to their material composition, each layer will accommodate an optical wavelength of one quarter of a wavelength of light for the color desired. The physical thickness of each layer will be adjusted per the index of refraction of the material from which the layer is formed. The layers may be alternated in high and low indices of refraction. Layers of a high index of refraction will be comparatively thinner while layers of a lower index of refraction will be comparatively thicker in order to maintain an optical path length of a quarter wavelength in each of the deposited layers. Put another way, the quarter wavelength of light will precisely "fit" in each of these layers. This fitting of the quarter wavelength of light will be based on a combination of the physical thickness of the individual dielectric layers, and the index of refraction for the material from which each of those dielectric layers may be formed. In embodiments, an alternating of dielectric materials among layers may typically vary between combinations of high indices of refraction and low indices of refraction in order that the physical thicknesses of pairs of dielectric material layers will be slightly different with respect to one another. Generally, the outermost dielectric layer may be formed of a low index of refraction (less than 2) material, and formed to be comparatively thicker in order to maintain separation between the coloration components of the multi-layered spherical structures. The low index of refraction of that formed outer layer is intended to mirror an index of refraction of the substantially clear binder material in which the particles may be suspended for delivery onto substrate surfaces.

Additionally in embodiments, there may be metallic layers sandwiched in between each pair of dielectric layers. A thickness of the metallic layers may be between 0.01 nm and 10 nm, while remaining transparent. Typically, these metallic layers may be on the order of 1 nm (or approximately 10 atoms) in thickness. The presence of such metallic layers is intended to enhance reflectivity properties with respect to the multi-layered structure of the color yielding/generating layers of the substantially transparent multi-layer micronsized particles. In a thickness of up to 10 nm, such metallic layers would remain substantially transparent.

Given that light is electromagnetic phenomenon, it has a strong interaction with metallic layers as conductors. The presence, therefore, of the above-described metallic layers may significantly enhance the reflection at the individual layers.

An additional benefit is that some additional color tunability is provided by a structure with variability in the compositions of the various layers. It is recognized that there will be some very slight (nearly infinitesimal) increase in the absorption of light based on the presence of the metallic layers. The benefits in reflectivity and tunability, however, far outweigh any disadvantage from this very minimal increase in absorption. Indium titanium oxide (ITO) is an example of a metallic layer that is conductive, yet substantially transparent. A typical touch screen on a cellular telephone, for example, includes an ITO surface.

Depending on a thickness of any included metallic layers, the dielectric index of refraction may not need to be varied as much in the selection of the materials for the pairs of dielectric layers. If in a particular set of material layers, each layer has a same index of refraction, in a manner similar to the manner in which a distributed Bragg reflector or filter is constructed in a fiber-optic core, a very high reflection would be produced at a particular wavelength. Interspersing the metallic layers allows for the dielectric layers to be each of a similar construction with regard to an index of refraction in thickness thereby simplifying the manufacturing process. The variance in thickness among the dielectric layers may approach zero in some cases.

Generally, there will not be a metallic layer on the outside surface of the substantially transparent multi-layer micronsized particle. As indicated generally above, the outer layer should be of a particular thickness (up to 10 times a thickness of the color constituent layers) and with a low index of refraction in order to provide a same index of refraction of the binder material and enough thickness in the layer to support the required separation between the color yielding/color generating layers of substantially transparent multi-layer micron-sized particles.

In a manner similar to quarter wavelength antireflection coating layers, in which a broad response may be narrowed by adding additional layers, a particular number of quarter wavelength layers over the half wavelength diameter spherical core in the substantially transparent multi-layer micronsized particles may define the sharpness (or single color precision) of the generated color response of the substantially transparent multi-layer micron-sized particles. A 30 layer particle may have a spectral response of about 10 nanometers in width (a narrow red, for example) while a 10 layer particle may have a spectral response of about 50 nanometers in width (much broader and combining a spectrum of hues on either side of a particular primary color). The number of layers in the particle will determine how broad a swath of the spectrum on either side of the peak is included.

It should be noted that the above discussion is not limited to monochromatic-only particles in which each of the quarter wavelength layers is intended to enhance the single color of the core of the multi-layered spherical particle, i.e., a single color of interest. Rather, the individual quarter wavelength layers may provide variable constituent hues that cause the finished particles to arrive at some combination of intermediary colors. Certain colors may be better perceived, for example, when they are comprised of mixture of different hues in the constituent layers. A width of the swath of the spectrum represented may be varied based on the presence of separate hues represented by the quarter wavelength thicknesses of the constituent layers.

It is also noted that the spectral response of the particles that the disclosed schemes are intended to portray is with respect to sunlight rather than artificial light. The visible response, i.e., the reflections, will be different as between exposure to artificial light and to sunlight.

Separately, the above discussion is not intended to imply that exemplary embodiments of mixed dispersions of particles suspended in particular binder or matrix materials are limited to suspension of single color (monochromatic or mixed) particles in the binder or matrix. The particles produced according to the disclosed schemes may be held in suspensions that are mixable in the same manner that pigment particles are held in suspensions that are mixable to arrive at a broad spectrum of colors. In this regard, individual colors of suspended particle solutions may be mixed, in a same manner as paint pigments, to arrive at a broad spectrum of color combinations. According to these various alternatives, there is a broader array of options for color control than exists, however, in conventional pigmented particle paint-type solutions.

Any suitable acrylic, polyurethane, clearcoat, or like composed binder or matrix material having a low index of refraction may be adapted to suspend the layer micron-sized particles for application to a broad spectrum of substrate materials. These may include, but not be limited to, for example, synthetic or natural resins such as alkyds, acrylics, vinyl-acrylics, vinyl acetate/ethylene (VAE), polyurethanes, polyesters, melamine resins, epoxy, silanes or siloxanes or oils. It is envisioned that, in the same manner that paint pigment particles are suspended in solution, the substantially transparent multi-layer micron-sized particles according to this disclosure may be suspended in solution as well. Unlike paint pigment particles, however, the optical response of particles according to the disclosed schemes will not "fade" over time because there is no pigment breakdown based on exposure to, for example, ultraviolet (UV) radiation. The disclosed particles will also be substantially insensitive to heat.

Figure 6:
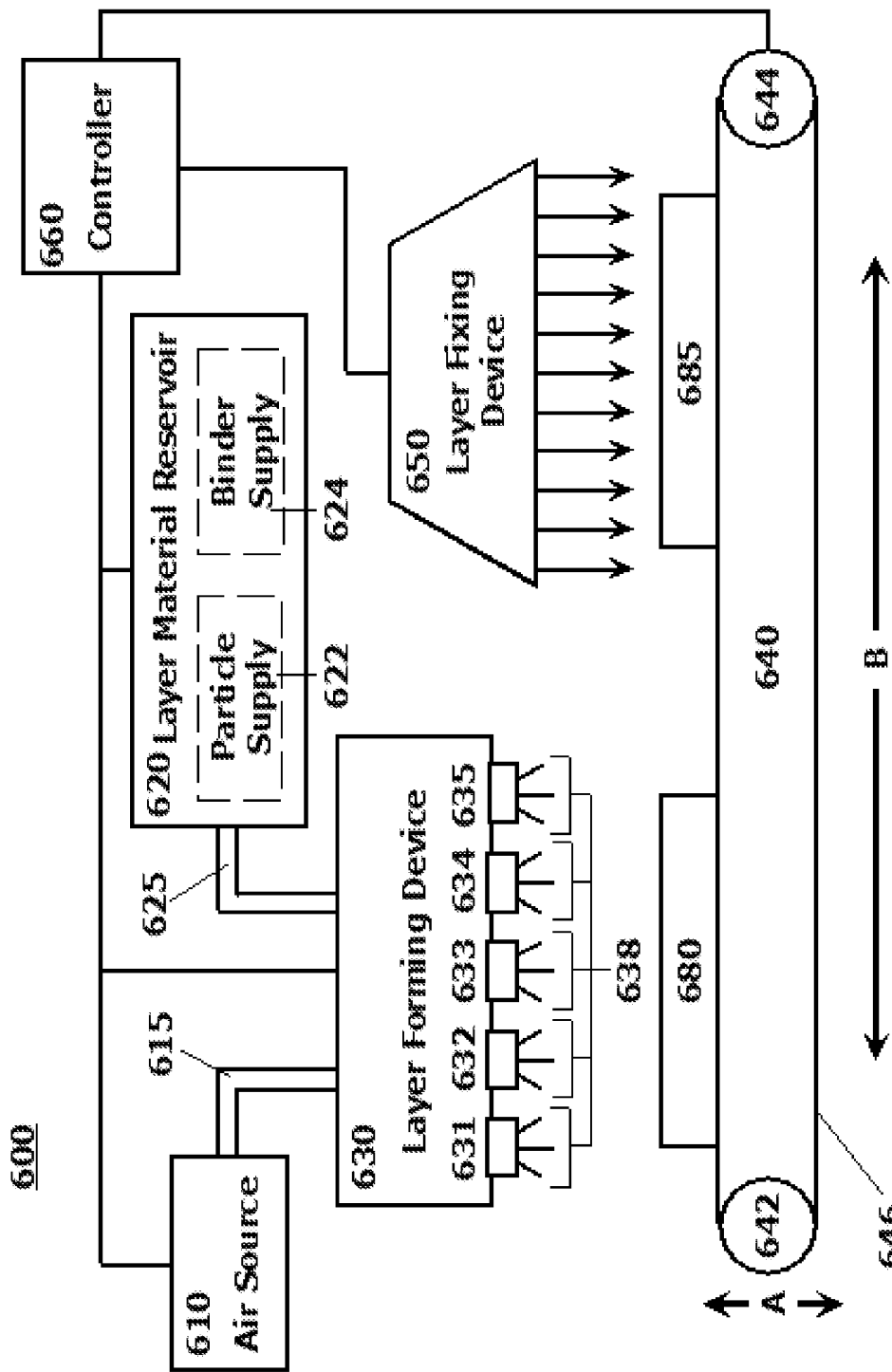

According to the above, application methodologies that are supportable with particles according to the disclosed schemes include all of those that are available for application of paints, inks and other coloration substances to substrates. These include that the particle-suspended solutions can be brushed on, rolled on, sprayed on and the like. Separately, the particles may be pre-suspended in the solutions or provided separately for on-site apparatus mixing into the deliverable solutions at the point of delivery to a particular surface. The particles may be delivered via conventional aspirated spray systems and/or via aerosol propellants including being premixed with the propellants for conventional spray can delivery. Finally, the particles may be dry delivered to a binder-coated substrate. Conventional curing methods may be employed to fix the binder-suspended particles on the various substrates. A reason that the latitude exists in the delivery methods, substrates and binder materials is based on the composition of the particles themselves, which renders the particular light transmissive/reflective properties to the particle solutions and layers produced therefrom.

In the above-described manner, a finished and stabilized apparent colored, multi-component colored, texturized or otherwise image-developed surface transparent light scattering layer is produced. Mass production of such layers could be according to known delivery, deposition and development methods for depositing the light scattering layer forming components on the base structures as layer receiving substrates, and automatically controlling the exposure, activation and/or stabilization of the surface components to achieve a particular colored, multi-colored, texturized and/or image-wise patterned light scattering layer surface.

Additives may be included in the binder or matrix materials in which the substantially transparent multi-layer micron-sized particles are, or are to be, suspended to enhance one or more of a capacity for adherence of the formed transmissive layer to a particular substrate, including an adhesive or the like, and a capacity for enhanced curing of the layer, including a photo initiator or the like.

Exemplary light scattering surface layers according to this disclosure when viewed in plan form from a viewing, observation or light-incident side, may present varying colors and/or textures. These may include, but are not limited to: (1) a light scattering surface layer that is formed to scatter a same wavelength of light across an entire light scattering surface layer thus producing a single visible color; (2) a light scattering surface layer that is formed to scatter a first wavelength of light as a background color, and a plurality of second wavelengths of light as other color/texture portions within determined areas of the light scattering surface layer to thus produce some manner of a multi-color and/or textured appearance in the light scattering surface layer; and (3) a light scattering surface layer that is formed to scatter a first wavelength of light as a first background color, a second (or more) wavelengths of light as second intermediate background color(s), and a plurality of third wavelengths of light as color/texture/image portions within determined areas of the light scattering surface layer to thus produce some manner of a multi-color, multi-texture and/or image-wise appearance in the light scattering surface layer.

In all of the embodiments described above, it should be appreciated that the various light scattering layers may be formed in a manner to allow the first determined wavelengths of light to pass through the light scattering layers as selected wavelengths in a visible, near-visible or non-visible range, and to allow the second determined wavelengths of light to be scattered as selected wavelengths primarily in the visible range. The single color, multi-color, multi-textured or image-wise visual presentations may result from deposition of substantially transparent multi-layer micron-sized particles formed or tuned to have refractive indices in select portions of the overall light scattering layers.

FIG. 6 illustrates a schematic diagram of an exemplary assembly line system 600 usable for automated forming of energy/light scattering surface layers on structural body members including photocell array layers according to this disclosure. The exemplary system 600 may be used to prepare and build individual energy/light scattering layers as additive layers on a base body structure, or as individual layers disposed on differing substrates.

As shown in FIG. 6, the exemplary system 600 may include a layer forming device 630. The layer forming device 630 may comprise a plurality of spray nozzles or spray heads 631-635, which may be usable to facilitate deposition of a layer forming material on a surface of an object or substrate when positioned in a material deposition position 680.

The layer forming device 630 may be connected to an air source 610 via piping 615 and may separately be connected to a layer material reservoir 620 via piping 625. The layer forming device 630 may be usable to obtain a flow of layer material from the layer material reservoir 620 and in train that layer material in an airstream provided by the air source 610 in a manner that causes aspirated layer material 638 to be ejected from the spray nozzles or spray heads 631-635 in a direction of the object or substrate when positioned in a material deposition position 680 opposite the layer forming device 630.

The layer material reservoir 620 may include separate chambers for a supply of substantially transparent multi-layer micron-sized particles, particle supply 622, and for a supply of binder or matrix material, binder supply 624. In embodiments, the particles and the matrix material may come premixed, the particles and matrix material may be mixed in the layer material reservoir 620, or the particles and matrix material may be separately fed to the layer forming device 630 and mixed therein before being entrained in the airstream provided to the layer forming device 630 by the air source 610. It should be noted that, in embodiments, an air source propellant, particles and matrix material may all be premixed in, for example, an enclosed aerosol container. Separately, it should be noted that, in embodiments, the layer forming device 630 may include an articulated arm with one or more spray nozzles or spray heads 631-635 mounted on a distal end as a layer forming robotic arm. Additionally, in embodiments, a particle and matrix material mixture may be provided in a material supply reservoir of a conventional spray gun with an air source being provided by a portable compressor for delivery of the layer material in a delivery operation similar to a conventional spray painting of a surface.

The object or substrate may be translatable in direction A to optimally position the object or substrate with respect to the layer forming device 630, in order to accommodate substrates and objects of varying sizes for optimal deposition and development of the energy/light scattering layers thereon.

The object or substrate may be translatable in a direction B between the material deposition position 680 and a curing/finishing position 685 opposite a layer fixing device 650 that may employ known layer fixing methods including using heat, pressure, photo-initiated chemical reactions and the like to cure and/or finish the energy/light scattering layers on the object or the substrate. The object or substrate may be translatable in direction B using, for example, a conveyor transport system 640 or other comparable transport system, including but not limited to, a robotic arm-type material transport device. The conveyor transport system 640, as depicted in FIG. 6, may comprise a series of conveyor rollers 642, 644 about which a conveyor belt 646 may be made to circulate. The conveyor transport system 640 may have elements that are movable vertically in direction A in order to accommodate the layer forming and fixing processes undertaken by the exemplary system 600.

The exemplary system 600 may operate under the control of a processor or controller 660. Layer and object forming information may be input regarding at least one energy/light scattering layer to be formed and fixed on an object or substrate by the exemplary system 600. The controller 660 may be provided with object forming data that is devolved, or parsed, into component data to execute a controllable process in which one or more energy/light scattering layers are formed to produce a single color, a multi-color, texturized surface or an image-patterned presentation when viewed from the viewing, observation or energy/light incident side of a finished energy/light scattering layer on a substrate or on a finished object of which the energy/light scattering layer is a component. The controller 660 may control movement of the conveyor transport system 640 and operation of the layer fixing device 650 in addition to controlling the mixture, entrainment and delivery of the material composition for forming the energy/light scattering layer.

Figure 7:
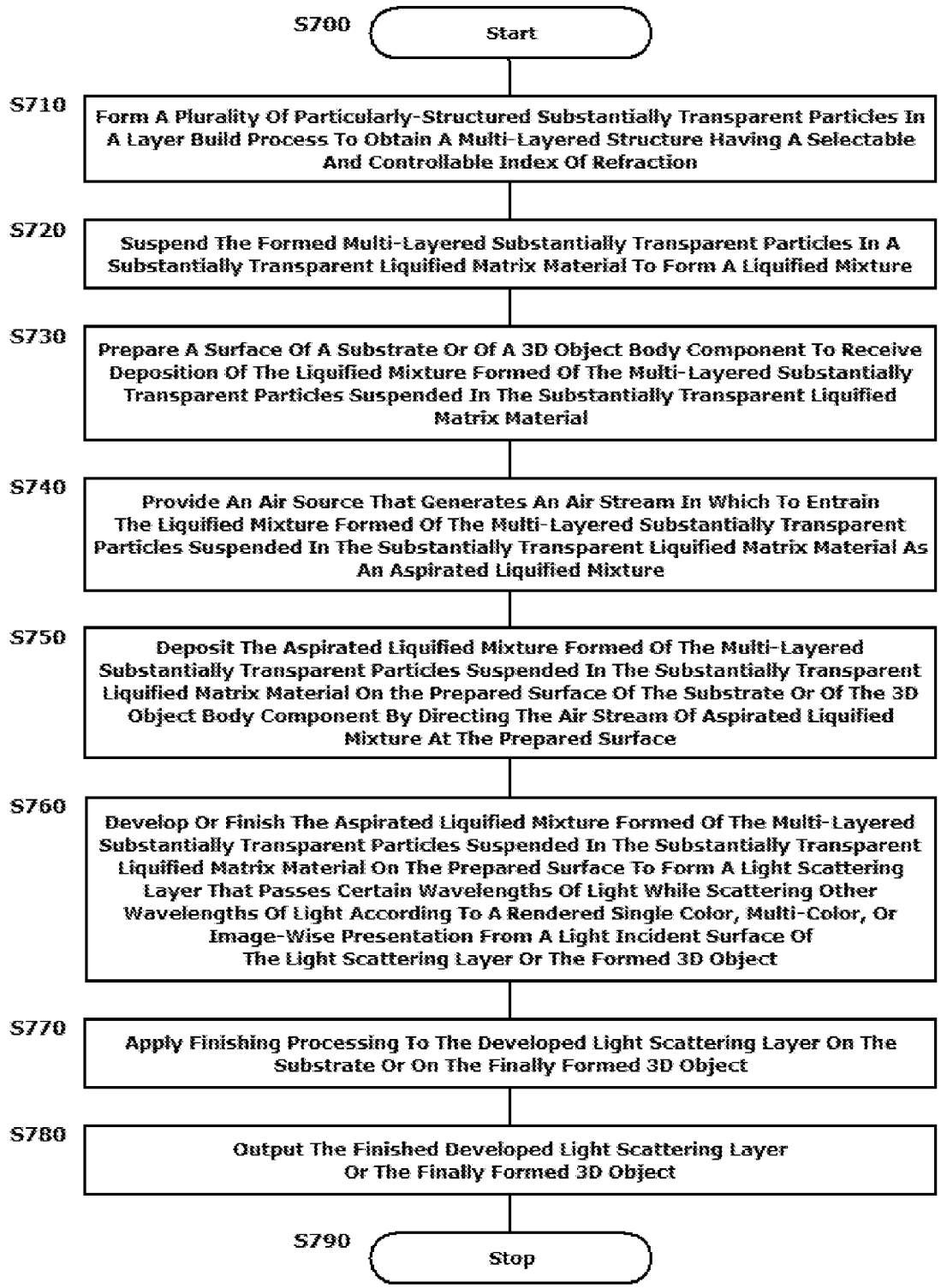

The disclosed embodiments may include methods for forming a light-scattering layer, as an autonomous structure, or on some manner of energy harvesting structural body member, having an opaque outward appearance based on inclusion of an energy/light scattering surface layer formed over a photocell layer according to this disclosure FIG. 7 illustrates a flowchart of such an exemplary method. As shown in FIG. 7, operation of the method commences at Step S700 and proceeds to Step S710.

In Step S710, a plurality of particularly-structured substantially transparent particles may be formed in a layer build process as described above. The formed particles may represent a multi-layered structure having a selectable and controllable index of refraction based on layering of quarter wavelength dielectric layers and interspersing of thin metallic layers therebetween. The multi-layered structures for the plurality of substantially transparent particles may then be encapsulated in clear outer layers or shells to produce substantially transparent particles having a diameter of 5 microns or less. Operation of the method proceeds to Step S720.

In Step S720, the formed multi-layered substantially transparent particles may be suspended in a substantially transparent liquefied matrix material to form a liquefied mixture. The substantially transparent liquefied matrix material may be selected to have an index of refraction similar to the clear outer layers or shells of the substantially transparent particles in order to substantially reduce any potential for refractive interference between adjacent particles when deposited on substrate or object surfaces. The substantially transparent liquefied matrix material may include components to aid in adherence of the finished energy/light transmissive layers on the substrates or objects on which those layers are ultimately formed. The substantially transparent liquefied matrix material may include components to aid in fixing of the substantially transparent particles in the layer, including heat-activated and/or light-activated hardeners. Operation of the method proceeds to Step S730.

In Step S730, a surface of a substrate or a surface of an in-process object body component may be prepared (or conditioned) to receive deposition of the liquefied mixture. The surface preparation may include deposition of one or more substantially-transparent matrix component materials, including, but not limited to, dielectric component materials, on the substrate or the surface of the in-process object body onto which the plurality of substantially-transparent particles of the layer forming material may be deposited. Operation of the method proceeds to Step S740.

In Step S740, a compressed air or other gas source may be provided to generate an airstream or gaseous stream in which to entrain the liquefied mixture to generate an aspirated liquefied mixture. As indicated above, the compressed air or other gas source may not be particularly limited to any class of compressor, bottled pressurized gas reservoir, or other resource including a pump. Virtually any pressurized air source is contemplated. The sizing of the particles to be less than 5 microns expands the latitude by which the substantially transparent particles suspended in the matrix material may be delivered to the substrate or in-process object body structures. Operation of the method proceeds to Step S750.

In Step S750, the aspirated liquefied mixture may be directed via compatible nozzles at the prepared surface of the substrate or the object body structure by directing the airstream of the aspirated liquefied mixture at the prepared surface. In a delivery process that mirrors conventional spray painting, the aspirated liquefied mixture may be deposited on the prepared surface to form an energy/light scattering layer that passes certain wavelengths of energy/light through the layer and scatters other selectable wavelengths of energy/light according to the refractive index tuned into the substantially transparent particles. A multi-layer build process may render a perceptibly single color, multi-color, patterned, texturized or image-wise presentation of scattered light from the light incident surface based on one or more delivery passes for depositing the energy/light scattering layer according to the above-described schemes. Operation of the method proceeds to Step S760.

In Step S760, the deposited aspirated liquefied mixture may be developed or finished on the prepared surface of the substrate or in-process object structure to form the fixed energy/light scattering layer thereon. Operation of the method proceeds to Step S770.

In Step S770, a finishing processing may be applied to the developed energy/light scattering layer on the substrate or on the finally formed object. Such finishing processing may include incorporating an outer protective layer over the energy/light scattering layer on the substrate or on the finally formed object. Operation of the method proceeds to Step S780.

In Step S780, the formed and finished energy/light scattering layer on the substrate or finally-formed and finished object may be output from the forming system. Operation of the method proceeds to Step S790, where operation of the method ceases.

The disclosed embodiments may include a non-transitory computer-readable medium storing instructions which, when executed by a processor, may cause the processor to execute all, or at least some, of the steps of the method outlined above.

As is indicated above, refractive indices of the energy/light scattering layers can be modified according to a specific mechanism for layered development of substantially transparent particles that when formed are comprised of a substantially spherical inner core and as many as 30+ dielectric layers applied in a layer forming process over that inner core with the finally formed substantially transparent particles having overall diameters in a range of 5 microns or less.

The above-described exemplary particle and material formulations, systems and methods reference certain conventional components, sensors, materials, and real-world use cases to provide a brief, general description of suitable operating, product processing, energy/light scattering layer forming and object forming environments in which the subject matter of this disclosure may be implemented for familiarity and ease of understanding. Although not required, embodiments of the disclosure may be provided, at least in part, in a form of hardware control circuits, firmware, or software computer-executable instructions to control or carry out the specific energy/light scattering layer forming functions described. These may include individual program modules executed by processors.

Those skilled in the art will appreciate that other embodiments of the disclosed subject matter may be practiced in many disparate film forming, layer forming, laminate layer forming and object forming systems, techniques, processes and/or devices, including various machining molding, additive and subtractive layer forming and manufacturing methods, of many different configurations.

As indicated above, embodiments within the scope of this disclosure may include computer-readable media having stored computer-executable instructions or data structures that can be accessed, read and executed by one or more processors for controlling the disclosed energy/light scattering layer forming and object forming schemes. Such computer-readable media can be any available media that can be accessed by a processor, general purpose or special purpose computer. By way of example, and not limitation, such computer-readable media can comprise RAM, ROM, EEPROM, CD-ROM, flash drives, data memory cards or other analog or digital data storage device that can be used to carry or store desired program elements or steps in the form of accessible computer-executable instructions or data structures for carrying into effect, for example, computer-aided design (CAD) or computer-aided manufacturing (CAM) of particular objects, object structures, layers, and/or layer components.

Computer-executable instructions include, for example, non-transitory instructions and data that can be executed and accessed respectively to cause a processor to perform certain of the above-specified functions, individually or in various combinations. Computer-executable instructions may also include program modules that are remotely stored for access and execution by a processor.

The exemplary depicted sequence of executable instructions or associated data structures for carrying into effect those executable instructions represent one example of a corresponding sequence of acts for implementing the functions described in the steps of the above-outlined exemplary method. The exemplary depicted steps may be executed in any reasonable order to carry into effect the objectives of the disclosed embodiments. No particular order to the disclosed steps of the methods is necessarily implied by the depiction in FIG. 7, except where a particular method step is a necessary precondition to execution of any other method step.

Although the above description may contain specific details, they should not be construed as limiting the claims in any way. Other configurations of the described embodiments of the disclosed systems and methods are part of the scope of this disclosure.

It will be appreciated that various of the above-disclosed and other features and functions, or alternatives thereof; may be desirably combined into many other different systems or applications. Also, various alternatives, modifications, variations or improvements therein may be subsequently made by those skilled in the art which are also intended to be encompassed by the following claims.

We claim:

1. A method for making an aerosol-deliverable material composition, comprising:
   providing a substantially transparent liquid binder material; and
   suspending a plurality of multi-layered transparent particles in the liquid binder material, each of the plurality of multi-layered transparent particles comprising:
      a spherical core comprised of a first transparent dielectric material, the spherical core having a value of a physical diameter equal to a half wavelength of a first selected color of light component to be reflected by the particle modified by a refractive index of the first transparent dielectric material;
      a plurality of material layers formed on the spherical core, each of the plurality of material layers being comprised at least a second transparent dielectric material, and having a value of a physical thickness equal to a quarter wavelength of at least a second selected color of light component to be reflected by the particle modified by a refractive index of the at least the second transparent dielectric material; and
      an applied outer coating comprised of another transparent dielectric material having a selected index of refraction of 2 or less, the applied outer coating having a thickness selected to achieve a desired spacing between the material layers of adjacent multi-layered transparent particles so as to substantially eliminate reflective interference between the colors of light reflected by adjacent particles when the applied outer coatings of said adjacent multi-layered transparent particles are in contact with one another.

2. The method of claim 1, modifying an index of refraction of the substantially transparent liquid binder material to be equal to the selected index of refraction of the applied outer coating.

3. The method of claim 1, the substantially transparent liquid binder material being selected from a group consisting of synthetic or natural resins, alkyds, acrylics, vinyl-acrylics, vinyl acetate/ethylene (VAE), polyurethanes, polyesters, melamine resins, epoxy, and silanes or siloxane s.

4. The method of claim 1, further comprising providing an adhesive additive to the substantially transparent liquid binder material, the adhesive additive facilitating adherence of the material composition to a surface.

* * * * *